(12) United States Patent
Dai et al.

(10) Patent No.: US 12,300,611 B2
(45) Date of Patent: May 13, 2025

(54) INTERCONNECT CONDUCTIVE STRUCTURE COMPRISING TWO CONDUCTIVE MATERIALS

(71) Applicant: Taiwan Semiconductor Manufacturing Company, Ltd., Hsinchu (TW)

(72) Inventors: Yu-Teng Dai, New Taipei (TW); Hsi-Wen Tien, Xinfeng Township (TW); Wei-Hao Liao, Taichung (TW); Hsin-Chieh Yao, Hsinchu (TW); Chih Wei Lu, Hsinchu (TW); Chung-Ju Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 413 days.

(21) Appl. No.: 17/370,087

(22) Filed: Jul. 8, 2021

(65) Prior Publication Data
US 2023/0009072 A1  Jan. 12, 2023

(51) Int. Cl.
*H01L 23/532* (2006.01)
*H01L 21/3213* (2006.01)
*H01L 21/768* (2006.01)

(52) U.S. Cl.
CPC .. *H01L 23/53238* (2013.01); *H01L 21/32139* (2013.01); *H01L 21/76829* (2013.01); *H01L 21/7684* (2013.01); *H01L 21/76877* (2013.01); *H01L 21/76885* (2013.01)

(58) Field of Classification Search
CPC ......... H01L 21/76886; H01L 21/76834; H01L 21/76802; H01L 23/53238; H01L 21/32139; H01L 21/76877; H01L 23/52–5389; H01L 24/24; H01L 21/76829; H01L 21/7684; H01L 21/76885; H01L 21/76847; H01L 21/76852
See application file for complete search history.

(56) References Cited

U.S. PATENT DOCUMENTS

| 5,614,765 A | * | 3/1997 | Avanzino | ............ | H01L 23/5226 257/E21.507 |
| 6,465,343 B1 | * | 10/2002 | Wang | ................ | H01L 21/76885 438/626 |
| 2013/0069233 A1 | * | 3/2013 | Chou | ................ | H01L 21/76885 257/E23.141 |

(Continued)

*Primary Examiner* — Mary A Wilczewski
*Assistant Examiner* — Nathan Pridemore
(74) *Attorney, Agent, or Firm* — Eschweiler & Potashnik, LLC (57) ABSTRACT

In some embodiments, the present disclosure relates to an integrated chip that includes a first interconnect dielectric layer arranged over a substrate, a second interconnect dielectric layer arranged over the first interconnect dielectric layer, and an interconnect conductive structure arranged within the second interconnect dielectric layer. The interconnect conductive structure includes an outer portion that includes a first conductive material. Further, the interconnect conductive structure includes a central portion having outermost sidewalls surrounding by the outer portion of the interconnect conductive structure. The central portion includes a second conductive material different than the first conductive material.

20 Claims, 7 Drawing Sheets

(56) References Cited

U.S. PATENT DOCUMENTS

| | | | |
|---|---|---|---|
| 2016/0005691 A1* | 1/2016 | Liu | H01L 21/76877 257/758 |
| 2016/0133509 A1* | 5/2016 | Chiang | H01L 21/28088 438/666 |
| 2017/0236938 A1* | 8/2017 | Basker | H01L 21/76897 257/401 |
| 2018/0076133 A1* | 3/2018 | Bonilla | H01L 21/76877 |
| 2021/0098293 A1* | 4/2021 | van der Straten | H01L 21/76852 |
| 2021/0143065 A1* | 5/2021 | Gardner | H01L 27/092 |

* cited by examiner

INTERCONNECT CONDUCTIVE STRUCTURE COMPRISING TWO CONDUCTIVE MATERIALS

BACKGROUND

As dimensions and feature sizes of semiconductor integrated circuits (ICs) are scaled down, the density of the elements forming the ICs is increased and spacing between elements is reduced. Such spacing reductions are limited by light diffraction of photo-lithography, mask alignment, isolation and device performance among other factors. As the distance between any two adjacent conductive features decreases, the resulting capacitance increases, which will increase power consumption and time delay. Thus, manufacturing techniques and device design are being investigated to reduce IC size while maintaining or improving performance of the IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips may include a number of semiconductor devices (e.g., transistors, capacitors, inductors, etc.) and/or memory devices disposed over and/or within a semiconductor substrate. An interconnect structure may be disposed over the semiconductor substrate and coupled to the semiconductor devices. The interconnect structure may include interconnect conductive structures such as interconnect wires and interconnect vias within an interconnect dielectric layer. The interconnect conductive structures provide electrical pathways between different semiconductor devices disposed within and/or over the semiconductor substrate.

Some embodiments of an interconnect structure include a first interconnect conductive structure and a second interconnect conductive structure disposed within an interconnect dielectric layer. In some embodiments, the first and second interconnect conductive structures are laterally beside one another and comprise a same conductive material. However, in some embodiments, the second interconnect conductive structure may have a larger critical dimension than the first interconnect conductive structure, wherein the critical dimension may be defined as the smallest dimension of a feature. In some embodiments, different conductive materials are more suitable for different critical dimensions to meet electrical targets. For example, in some embodiments, copper has a better resistivity for critical dimensions greater than a predetermined critical dimension threshold (e.g., about 15 nanometers) compared to critical dimensions less than the predetermined critical dimension threshold (e.g., about 15 nanometers). Thus, in embodiments where the first and second interconnect conductive structures have different critical dimensions, using the same conductive material for the first and second interconnect conductive structures may result in an unreliable interconnect structure.

Various embodiments of the present disclosure relate to forming a first interconnect conductive structure having a first critical dimension below a predetermined critical dimension threshold that is laterally beside a second interconnect conductive structure having a second critical dimension above the predetermined critical dimension threshold. In such embodiments, the first interconnect conductive structure may comprise a first conductive material, whereas the second interconnect conductive structure may comprise an outer portion comprising the first conductive material surrounding outermost sidewalls of a central portion comprising a second conductive material. The second interconnect conductive structure comprising the first and second conductive materials may be formed by first forming the first and second interconnect conductive structures comprising the first conductive material. Then, a portion of the first conductive material of the second interconnect conductive structure may be selectively removed and replaced by the second conductive material. Thus, the first interconnect conductive structure may comprise the first conductive material that has suitable properties for critical dimensions that are below the predetermined critical dimension threshold, whereas the second interconnect conductive structure may comprise the second conductive material that has suitable properties for critical dimensions that are above the predetermined critical dimension threshold resulting in a more reliable interconnect structure.

Figure 1:
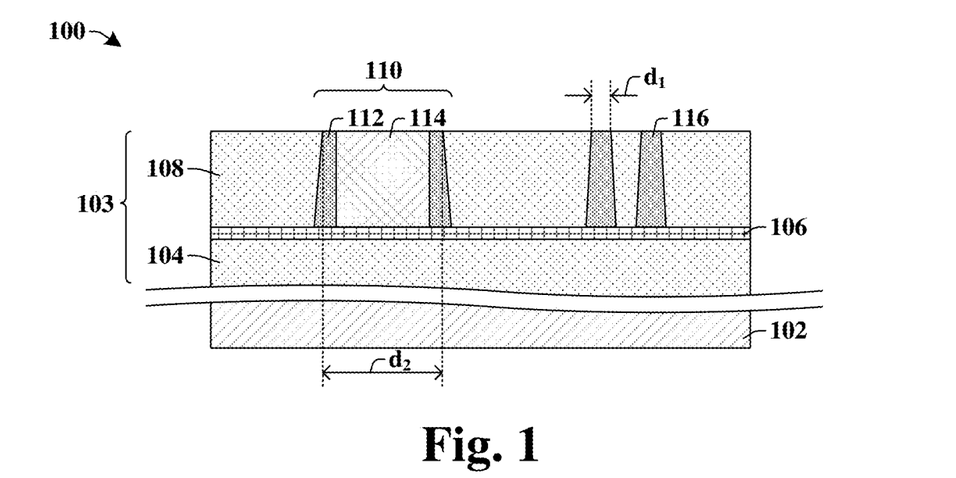
FIG. 1 illustrates a cross-sectional view of some embodiments of an integrated chip having an interconnect structure comprising an interconnect conductive structure that includes an outer portion comprising a first conductive material surrounding outermost sidewalls of a central portion comprising a second conductive material.

FIG. 1 illustrates a cross-sectional view 100 of some embodiments of an integrated chip comprising an interconnect structure having some interconnect conductive structures made up of two conductive materials.

The cross-sectional view 100 of FIG. 1 includes an interconnect structure 103 arranged over a substrate 102. In some embodiments, the interconnect structure comprises a first interconnect dielectric layer 104, a second interconnect dielectric layer 108 arranged over the first interconnect dielectric layer 104, a first interconnect conductive structure 116 arranged within the second interconnect dielectric layer 108, and a second interconnect conductive structure 110 arranged within the second interconnect dielectric layer 108 and laterally beside the first interconnect conductive structure 116. In some embodiments, an etch stop layer 106 is arranged directly between the first interconnect dielectric layer 104 and the second interconnect dielectric layer 108. In some embodiments, the etch stop layer 106 may comprise silicon dioxide, silicon oxynitride, silicon carbide, silicon oxygen carbide, silicon carbon nitride, silicon hydroxide, or some other suitable dielectric material.

In some embodiments, one or more semiconductor devices and/or memory devices (not shown) are arranged over or within the substrate 102. The interconnect structure 103 may provide conductive pathways for the transfer of signals (e.g., current, voltage) between various devices arranged above and below the interconnect structure 103. In some embodiments, the first and second interconnect conductive structures 116, 110 may be referred to as interconnect vias, interconnect wires, contact vias, or the like.

In some embodiments, the first interconnect structure 116 has a first critical dimension $d_1$, and the second interconnect structure 110 has a second critical dimension $d_2$. In some embodiments, a critical dimension may be defined as the smallest dimension of a feature. In some embodiments, the first critical dimension $d_1$ of the first interconnect conductive structure 116 is less than the second critical dimension $d_2$ of the second interconnect conductive structure 110. Further, in some embodiments, the first critical dimension $d_1$ may be less than a predetermined critical dimension threshold, whereas the second critical dimension $d_2$ may be greater than the predetermined critical dimension threshold. In some embodiments, the predetermined critical dimension threshold may be in a range of between, for example, approximately 10 nanometers and approximately 20 nanometers. For example, in some embodiments, the predetermined critical dimension threshold may be equal to about 15 nanometers.

In some embodiments, the predetermined critical dimension threshold may depend on a first conductive material of the first interconnect conductive structure 116. For example, in some embodiments, when the first conductive material is formed into a structure having a critical dimension less than the predetermined critical dimension, the structure comprising the first conductive material has reliable electrical properties (e.g., resistivity); however, if the first conductive material is formed into a structure having a critical dimension greater than the predetermined dimension, the structure comprising the first conductive material may have compromised electrical properties.

Therefore, in some embodiments, the first critical dimension $d_1$ of the first interconnect conductive structure 116 is less than the predetermined critical dimension threshold, and the first interconnect conductive structure 116 comprises the first conductive material. Further, in some embodiments, the second critical dimension $d_2$ of the second interconnect conductive structure 110 is greater than the predetermined critical dimension threshold, and the second interconnect conductive structure 110 comprises a central portion 114 comprising a second conductive material that has more reliable electrical properties (e.g., resistivity, etc.) at critical dimensions greater than the predetermined critical dimension threshold compared to the first conductive material. In some embodiments, the central portion 114 of the second interconnect conductive structure 110 has outermost sidewalls laterally surrounded by an outer portion 112 comprising the first conductive material. By removing portions of the first conductive material of the second interconnect conductive structure 110 and replacing the portions of the first conductive material with the second conductive material, the second interconnect conductive structure 110 may be formed laterally beside the first interconnect conductive structure 116 despite their differing critical dimensions such that the interconnect structure 103 is reliable.

Figure 2:
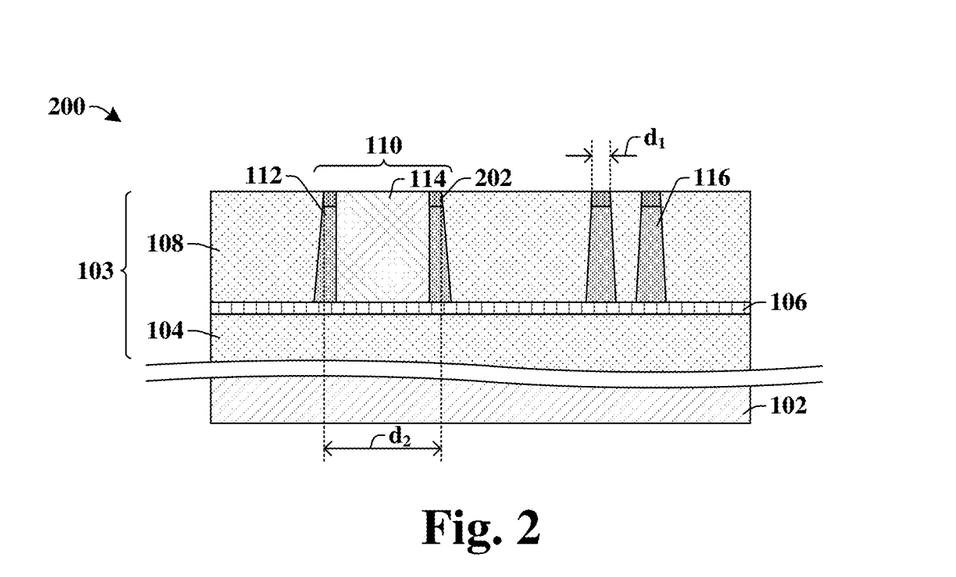
FIG. 2 illustrates a cross-sectional view of some additional embodiments of an integrated chip having an interconnect structure comprising an interconnect conductive structure that includes an outer portion comprising a first conductive material surrounding outermost sidewalls of a central portion comprising a second conductive material.

FIG. 2 illustrates a cross-sectional view 200 of some other embodiments of an integrated chip comprising an interconnect structure having some interconnect conductive structures made up of two conductive materials.

In some embodiments, the interconnect structure 103 further comprises a spacer structure 202. In some embodiments, the spacer structure 202 is arranged directly on features comprising the first conductive material and is not arranged directly on features comprising the second conductive material. Thus, in some embodiments, the spacer structure 202 is arranged directly on the first interconnect conductive structure 116 and directly on the outer portion 112 of the second interconnect conductive structure 110. In some embodiments, the spacer structure 202 acts as a masking structure during the formation of the central portion 114 of the second interconnect conductive structure 110. In such embodiments, portions of the first conductive material that are not directly covered by the spacer structure 202 are removed and replaced with the second conductive material to form the central portion 114 of the second interconnect conductive structure 110. In some embodiments, after the formation of the central portion 114 of the second interconnect conductive structure 110, the spacer structure 202 is not completely removed by a planarization process, as illustrated in the cross-sectional view 200.

In some embodiments, the spacer structure 202 has upper surfaces that are substantially coplanar with upper surfaces of the second interconnect dielectric layer 108 and the central portion 114 of the second interconnect conductive structure 116. In some embodiments, the central portion 114 of the second interconnect conductive structure 110 has a topmost surface that is above topmost surfaces of the outer portion 112 of the second interconnect conductive structure 110. In some embodiments, the spacer structure 202 comprises, for example, silicon dioxide, silicon oxygen carbide, silicon carbide, silicon carbon nitride, silicon oxynitride, silicon hydroxide, aluminum nitride, aluminum oxynitride, titanium nitride, tantalum nitride, titanium oxide, hafnium oxide, or the like. In some embodiments, the spacer structure 202 has a thickness in a range of between, for example, approximately 10 angstroms and approximately 400 angstroms.

Further, in some embodiments, the first conductive material of the first interconnect conductive structure 116 and of the outer portion 112 of the second interconnect conductive structure 110 comprises, for example, cobalt, aluminum, tungsten, ruthenium, rhodium, titanium, tantalum, a combination thereof, or the like. In some embodiments, the second conductive material of the central portion 114 of the second interconnect conductive structure 110 comprises, for example, copper, cobalt, aluminum, tungsten, ruthenium, rhodium, titanium, tantalum, a combination thereof, or the like. However, the second conductive material is different than the first conductive material. Further, in some embodiments, the first interconnect conductive structure 116 and the second interconnect conductive structure 110 have a thickness in a range of between, for example, approximately 50 angstroms and approximately 600 angstroms. In some embodiments, the first interconnect dielectric layer 104 and the second interconnect dielectric layer 108 may each comprise, for example, silicon dioxide, silicon oxygen carbide, silicon carbide, silicon carbon nitride, silicon oxynitride, silicon hydroxide, or the like. In some embodiments, the first interconnect dielectric layer 104 and the second interconnect dielectric layer 108 may each have a thickness in a range of between, for example, approximately 10 angstroms and approximately 400 angstroms.

Figure 3:
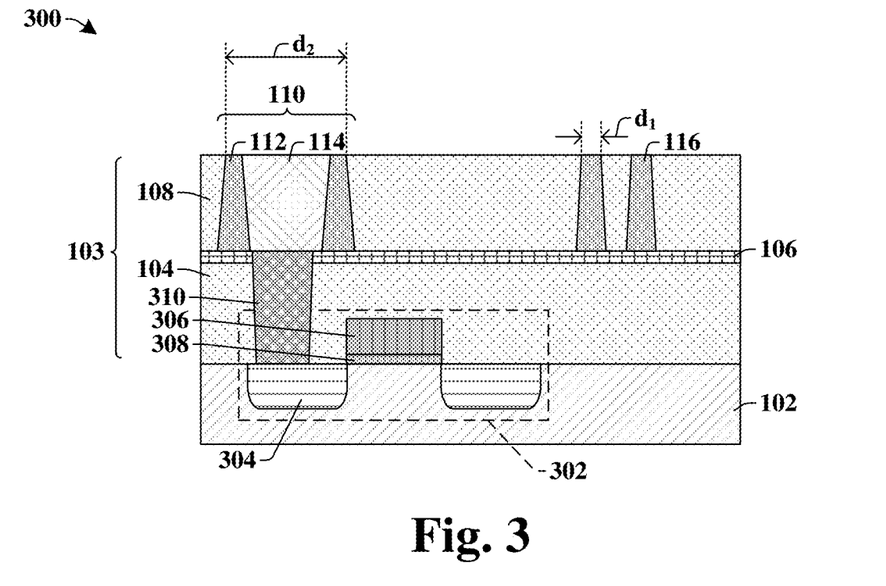
FIG. 3 illustrates a cross-sectional view of some embodiments of an integrated chip having an interconnect structure comprising an interconnect conductive structure that includes an outer portion comprising a first conductive material surrounding outermost sidewalls of a central portion comprising a second conductive material, wherein the interconnect conductive structure is coupled to a semiconductor device.

FIG. 3 illustrates a cross-sectional view 300 of some embodiments of an integrated chip comprising an interconnect structure having an interconnect conductive features comprising two conductive materials, wherein the interconnect structure is coupled to an underlying semiconductor device.

In some embodiments, the first interconnect conductive structure 116 has a topmost surface that is more narrow than a bottommost surface. Similarly, in some embodiments, the second interconnect conductive structure 110 has a topmost surface that is more narrow than a bottommost surface, wherein the topmost and bottommost surfaces of the second interconnect conductive structure 110 include the topmost and bottommost surfaces of the central and outer portions 114, 112 of the second interconnect conductive structure 110. In some embodiments, the central portion 114 of the second interconnect conductive structure 110 has a topmost surface that is wider than a bottommost surface of the central portion 114 of the second interconnect conductive structure 110.

In some embodiments, the interconnect structure 103 further comprises a contact structure 310 arranged within the first interconnect dielectric layer 104. In some embodiments, the contact structure 310 may extend through the etch stop layer 106 to directly contact the first or second interconnect conductive structures 116, 110. In some embodiments, the contact structure 310 may comprise tungsten, copper, aluminum, or the like.

In some embodiments, the contact structure 310 is coupled to an underlying semiconductor device 302. In some embodiments, the underlying semiconductor device 302 may comprise, for example, a field effect transistor (FET). In such embodiments, the semiconductor device 302 may comprise source/drain regions 304 arranged on or within the substrate 102. The source/drain regions 304 may comprise doped portions of the substrate 102. Further, in some embodiments, the semiconductor device 302 may comprise a gate electrode 306 arranged over the substrate 102 and between the source/drain regions 304. In some embodiments, a gate dielectric layer 308 may be arranged directly between the gate electrode 306 and the substrate 102. In some embodiments, the contact structure 310 is coupled to one of the source/drain regions 304, whereas in other embodiments, the contact structure 310 may be coupled to the gate electrode 306 of the semiconductor device 302. Further in some embodiments, it will be appreciated that the interconnect structure 103 may couple the semiconductor device 302 to some other semiconductor device, memory device, photo device, or some other electronic device. It will be appreciated that other electronic/semiconductor devices other than the FET illustrated as the semiconductor device 302 is also within the scope of this disclosure.

FIGS. 4-15 illustrate cross-sectional views 400-1500 of some embodiments of a method of forming an interconnect structure over a semiconductor substrate having first interconnect conductive structures comprising a first conductive material and second interconnect conductive structures comprising a second conductive material surrounded by the first conductive material based on a predetermined critical dimension threshold. Although FIGS. 4-15 are described in relation to a method, it will be appreciated that the structures disclosed in FIGS. 4-15 are not limited to such a method, but instead may stand alone as structures independent of the method.

Figure 4:
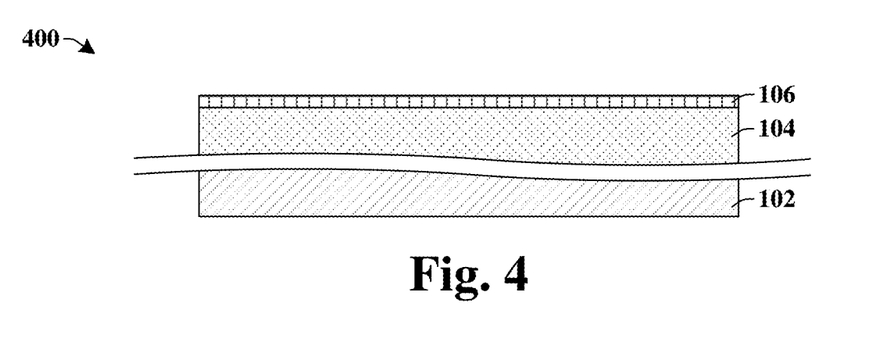
FIGS. 4-15 illustrate cross-sectional views of some embodiments of a method of forming an integrated chip comprising an interconnect conductive structure an outer portion comprising a first conductive material surrounding outermost sidewalls of a central portion comprising a second conductive material when the interconnect conductive structure has a larger critical dimension than a predetermined critical dimension threshold.

As shown in cross-sectional view 400 of FIG. 4, a substrate 102 is provided. In some embodiments, the substrate 102 may be or comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated with. In some embodiments, a first interconnect dielectric layer 104 is formed over the substrate 102. In some embodiments, various semiconductor devices (e.g., transistors, inductors, capacitors, etc.) and/or memory devices (not shown) may be arranged over and/or within the substrate 102 and beneath the first interconnect dielectric layer 104. In some embodiments, interconnect wires, interconnect vias, and/or contact vias (not shown) may also be formed within the first interconnect dielectric layer 104 and coupled to the one or more of the various semiconductor devices and/or memory devices (not shown).

In some embodiments, the first interconnect dielectric layer 104 may be formed by way of a deposition process (e.g., chemical vapor deposition (CVD), plasma enhanced CVD (PE-CVD), atomic layer deposition (ALD), etc.). In some embodiments, the first interconnect dielectric layer 104 may have a thickness in a range of between, for example, approximately 10 angstroms and approximately 400 angstroms. In some embodiments, the first interconnect dielectric layer 104 may comprise, for example, silicon carbide, silicon dioxide, silicon oxygen carbide, silicon nitride, silicon carbon nitride, silicon oxynitride, silicon oxygen carbon nitride, silicon hydroxide, or some other suitable dielectric material.

Further, in some embodiments, an etch stop layer 106 may be formed over the first interconnect dielectric layer 104. The etch stop layer 106 may, in some embodiments, protect the first interconnect dielectric layer 104, any underlying interconnect conductive structures, and/or any underlying semiconductor devices from future patterning steps. In some embodiments, the etch stop layer 106 comprises a different material than the first interconnect dielectric layer 104. In some embodiments, the etch stop layer 106 may comprise, for example, silicon dioxide, silicon oxynitride, silicon carbide, silicon oxygen carbide, silicon carbon nitride, silicon hydroxide, or some other suitable dielectric material. In some embodiments, the etch stop layer 106 may be formed by way of a deposition process (e.g., physical vapor deposition (PVD), chemical vapor deposition (CVD), plasma enhanced CVD (PE-CVD), atomic layer deposition (ALD), etc.). In some embodiments, the etch stop layer 106 may have a thickness in a range of between, for example, approximately 10 angstroms and approximately 200 angstroms.

Figure 5:
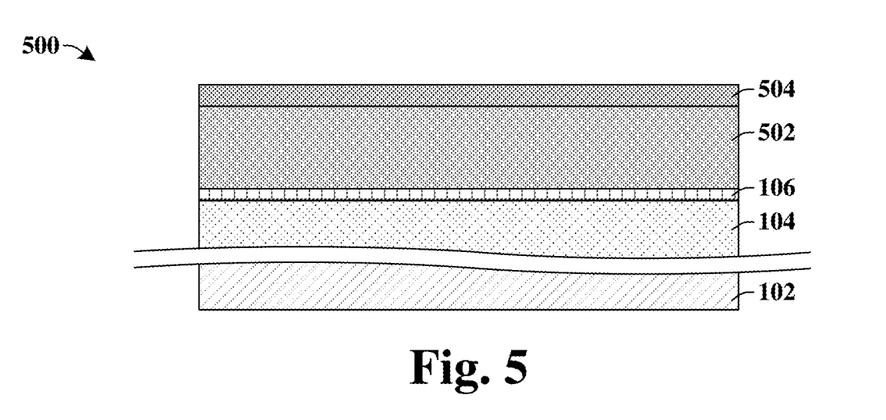

As shown in cross-sectional view 500 of FIG. 5, in some embodiments, a first conductive layer 502 comprising a first conductive material is formed over the etch stop layer 106. In some embodiments, the first conductive layer 502 may be formed by way of a deposition process (e.g., PVD, CVD, PE-CVD, ALD, sputtering, etc.). In some embodiments, the first conductive material of the first conductive layer 502 may comprise, for example, cobalt, aluminum, tungsten, ruthenium, rhodium, titanium, tantalum, a combination thereof, or some other suitable conductive material. In some embodiments, the first conductive layer 502 may have a thickness in a range of between, for example, approximately 50 angstroms and approximately 600 angstroms.

Further, in some embodiments, a hard mask layer 504 may be formed over the first conductive layer 502. In some embodiments, the hard mask layer 504 may be formed by way of a deposition process (e.g., spin-on, PVD, CVD, PE-CVD, ALD, etc.) and may comprise, for example, silicon nitride, silicon oxynitride, silicon carbide, or some other suitable hard mask material.

Figure 6:
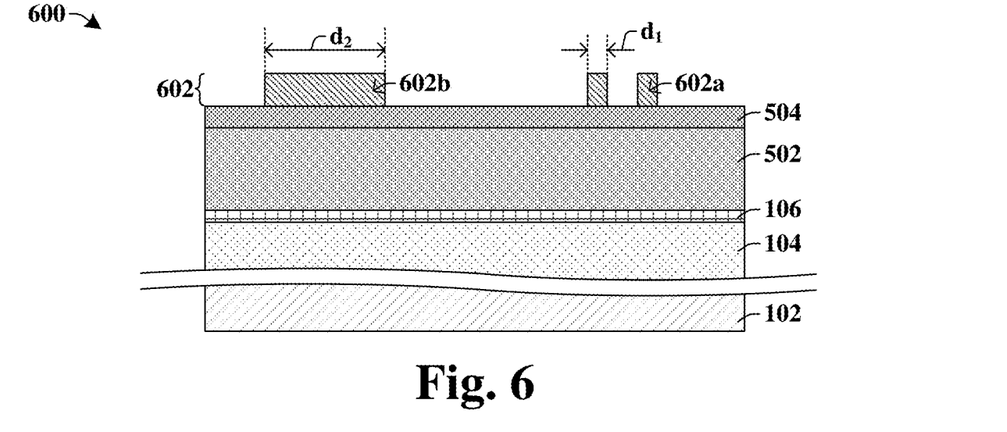

As shown in cross-sectional view 600 of FIG. 6, in some embodiments, a first masking structure 602 is formed over the hard mask layer 504. In some embodiments, the first masking structure 602 is formed by way of photolithography and removal (e.g., etching) processes. In some embodiments, the first masking structure 602 comprises a photoresist or a hard mask material. In some embodiments, the first masking structure 602 comprises one or more first segments 602a having a first critical dimension $d_1$ and one or more second segments 602b having a second critical dimension $d_2$. In some embodiments, the second critical dimension $d_2$ is greater than the first critical dimension $d_1$. In some embodiments, the first critical dimension $d_1$ may be in a range of between, for example, approximately 5 nanometers and approximately 20 nanometers, and the second critical dimension $d_2$ may be in a range of between, for example, approximately 15 nanometers and approximately 900 nanometers. It will be appreciated that other values of the first and second critical dimensions $d_1$, $d_2$ are also within the scope of this disclosure.

Figure 7:
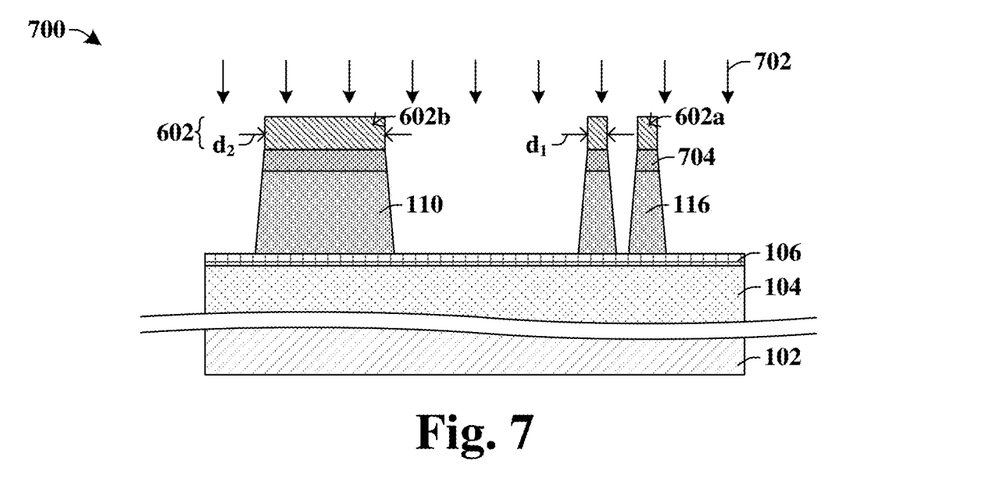

As shown in cross-sectional view 700 of FIG. 7, a first removal process 702 may be conducted to remove portions of the hard mask layer (504 of FIG. 6) and the first conductive layer (502 of FIG. 6) according to the first masking structure 602 to form a patterned hard mask layer 704 and first and second interconnect conductive structures 116, 110. In some embodiments, the first interconnect conductive structure 116 directly underlies the one or more first segments 602a of the first masking structure 602, and thus, the first interconnect conductive structure 116 has the first critical dimension $d_1$. Similarly, in some embodiments, the second interconnect conductive structure 110 directly underlies the one or more second segments 602b of the first masking structure 602, and thus, the second interconnect conductive structure 110 has the second critical dimension $d_2$.

Thus, the first removal process 702 may be or comprise an etching process. In some embodiments, the first removal process 702 comprises a dry etching process such as, for example, a plasma etch, reactive-ion etching, inductively coupled plasma, and/or capacitively coupled plasma. In such embodiments, the first removal process 702 may utilize one or more of the following gas etchants: a fluoride-based gas (e.g., $CH_3F$, $CHF_3$, $CH_2F_2$, $C_4F_8$, $C_4F_6$, $CF_4$, $NF_3$), chlorine, oxygen, or some other suitable gas. In some embodiments, the first removal process 702 may be conducted in a chamber set to a temperature in a range of between approximately 15 degrees Celsius and approximately 80 degrees Celsius; and to a pressure in a range of between approximately 0.2 millitorr and approximately 40 millitorr. In some embodiments, the substrate 102 is held within the chamber by an electrostatic chuck during the first removal process 702.

In some embodiments, the first and second interconnect conductive structures 116, 110 each have a topmost surface that is more narrow than a bottommost surface after the first removal process 702. Thus, from the cross-sectional view 700, in some embodiments, the first and second interconnect conductive structures 116, 110 may have a trapezoid-like profile.

Figure 8:
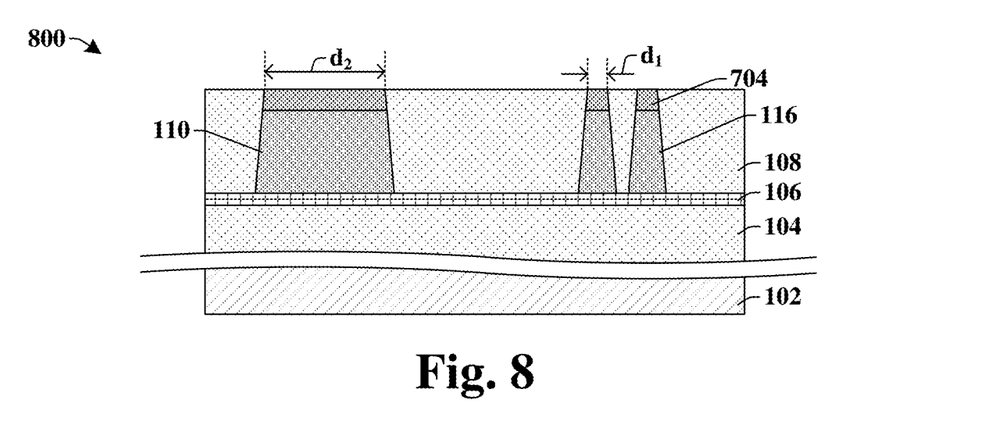

As shown in cross-sectional view 800 of FIG. 8, in some embodiments, a second interconnect dielectric layer 108 is formed over the etch stop layer 106 and laterally around the first and second interconnect conductive structures 110, 116. In some embodiments, the second interconnect dielectric layer 108 may be formed by way of a deposition process (e.g., PVD, CVD, PE-CVD, ALD, etc.) followed by a planarization process (e.g., chemical mechanical planarization (CMP)) to remove any of the second interconnect dielectric layer 108 arranged over the patterned hard mask layer 704. In some embodiments, the second interconnect dielectric layer 108 comprises, for example, silicon dioxide, silicon oxygen carbide, silicon carbide, silicon carbon nitride, silicon oxynitride, silicon hydroxide, or the like. In some embodiments, the second interconnect dielectric layer 108 may have a thickness in a range of between, for example, approximately 10 angstroms and approximately 400 angstroms.

Figure 9:
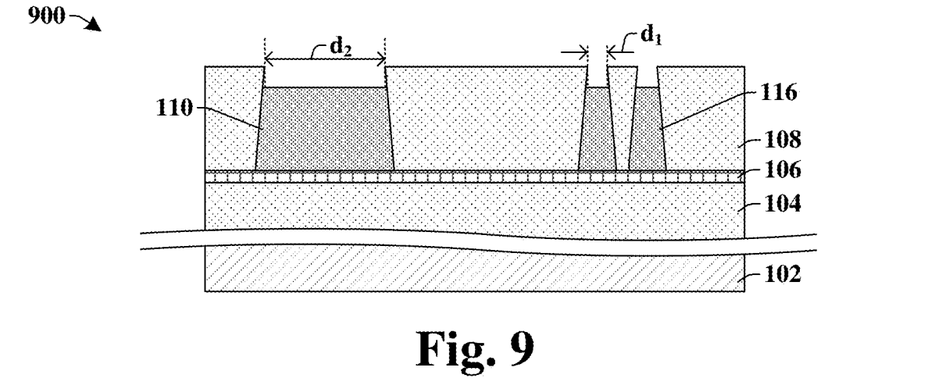

As shown in cross-sectional view 900 of FIG. 9, in some embodiments, the patterned hard mask layer (704 of FIG. 8) is removed thereby exposing topmost surfaces of the first and second interconnect conductive structures 116, 110. In some embodiments, the patterned hard mask layer (704 of FIG. 8) is removed by a wet or dry etchant, and the second interconnect dielectric layer 108 and the first and second interconnect conductive structures 116, 110 are substantially resistant to removal by the wet or dry etchant.

Figure 10:
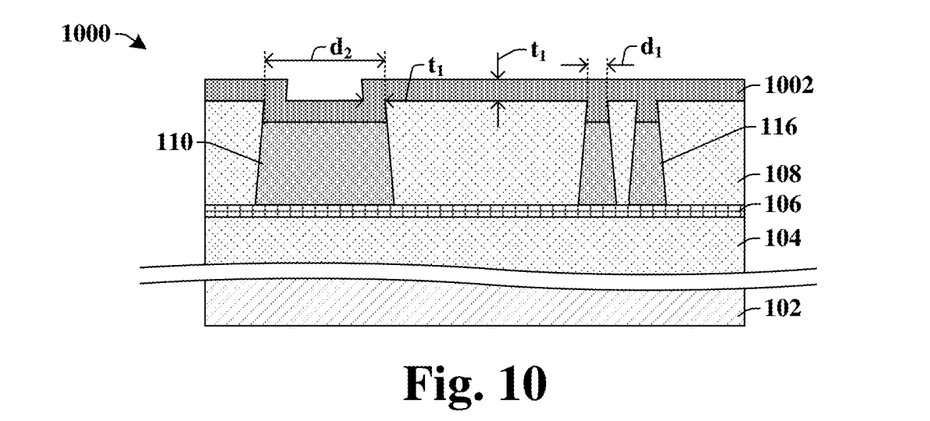

As shown in cross-sectional view 1000 of FIG. 10, in some embodiments, a spacer layer 1002 is formed over the second interconnect dielectric layer 108 and the first and second interconnect conductive structures 116, 110. In some embodiments, the spacer layer 1002 is formed by way of a deposition process (e.g., PVD, CVD, PE-CVD, ALD, etc.). In some embodiments, the spacer layer 1002 comprises, for example, silicon dioxide, silicon oxygen carbide, silicon carbide, silicon carbon nitride, silicon oxynitride, silicon hydroxide, aluminum nitride, aluminum oxynitride, titanium nitride, tantalum nitride, titanium oxide, hafnium oxide, or the like. In some embodiments, the spacer layer 1002 has a first thickness $t_1$ in a range of between approximately 10 angstroms and approximately 400 angstroms.

Figure 11:
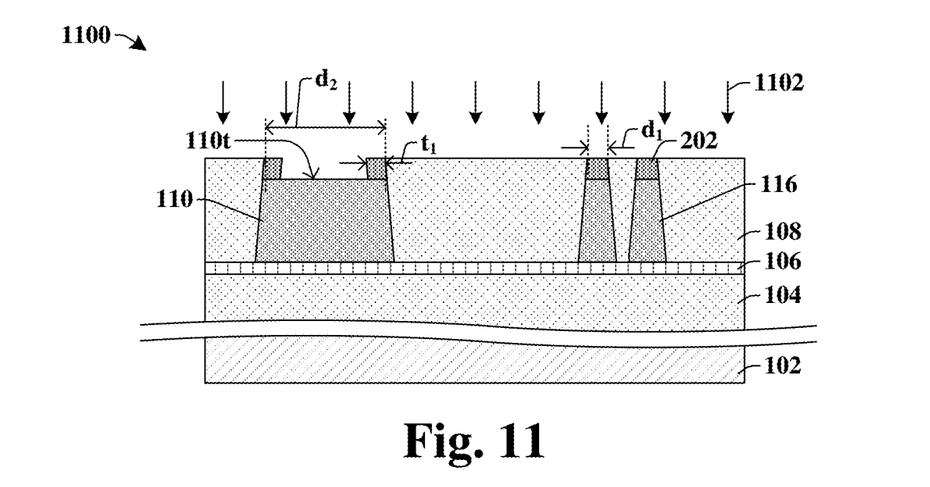

As shown in cross-sectional view 1100 of FIG. 11, a second removal process 1102 may be performed to remove substantially horizontal portions of the spacer layer (1002 of FIG. 10), thereby forming a spacer structure 202 over the first and second interconnect conductive structures 116, 110. In some embodiments, the second removal process 1102 may comprise a dry etching process such as, for example, a plasma etch, reactive-ion etching, inductively coupled plasma, and/or capacitively coupled plasma. In such embodiments, the second removal process 1102 may utilize one or more of the following gas etchants: a fluoride-based gas (e.g., $CH_3F$, $CHF_3$, $CH_2F_2$, $C_4F_8$, $C_4F_6$, $CF_4$, $NF_3$), chlorine, oxygen, or some other suitable gas. In some embodiments, the second removal process 1102 may be conducted in a chamber set to a temperature in a range of between approximately 15 degrees Celsius and approximately 80 degrees Celsius; and to a pressure in a range of between approximately 0.2 millitorr and approximately 40 millitorr. In some embodiments, the substrate 102 is held within the chamber by an electrostatic chuck during the second removal process 1102.

In some embodiments, the second removal process 1102 may be conducted for a predetermined time period based on the first thickness $t_1$, such that the second removal process 1102 removes the substantially horizontal portions of the spacer layer (1002 of FIG. 10) without completely removing the spacer layer (1002 of FIG. 10) from the first and/or second interconnect conductive structures 116, 110.

Further, in some embodiments, the first thickness $t_1$ of the spacer layer 1002 may be dependent on the first critical dimension $d_1$ of the first interconnect conductive structure 116 and on the second critical dimension $d_2$ of the second interconnect conductive structure 110. In some embodiments, the first critical dimension $d_1$ of the first interconnect conductive structure 116 is below a predetermined critical dimension threshold, wherein the first conductive material has favorable electrical properties, such as resistivity, when used in features (e.g., first interconnect conductive structure 116) below the predetermined critical dimension threshold. In some embodiments, the second critical dimension $d_2$ of the second interconnect conductive structure 110 is above a predetermined critical dimension threshold, wherein the first conductive material has less favorable properties, such as resistivity, when used in features above the predetermined critical dimension threshold.

In some such embodiments, because the first interconnect conductive structure 116 comprises the first conductive material that is suitable at the first critical dimension $d_1$, the spacer layer (1002 of FIG. 10) has a high enough first thickness $t_1$ to completely cover the first interconnect conductive structure 116 even after the second removal process 1102. Thus, the spacer structure 202 will protect the first interconnect conductive structure 116 from future removal processes. However, in some such embodiments, because the second interconnect conductive structure 110 comprises the second conductive material that is not as suitable at the second critical dimension $d_2$, the spacer layer (1002 of FIG. 10) has a small enough first thickness $t_2$ such that after the second removal process 1102, the spacer structure 202 does not cover a center topmost surface 110t of the second interconnect conductive structure 110. This way, the first conductive material of the second interconnect conductive structure 110 that is not directly under the spacer structure 202 may be removed and replaced by a second conductive material that has more suitable electrical properties, such as resistivity, above the predetermined critical dimension threshold compared to the first conductive material. For example, in some embodiments, the first thickness $t_1$ of the spacer layer (1002 of FIG. 10) is less than about half of the second critical dimension $d_2$ such that the spacer structure 202 does not completely cover the second interconnect conductive structure 110.

Figure 12:
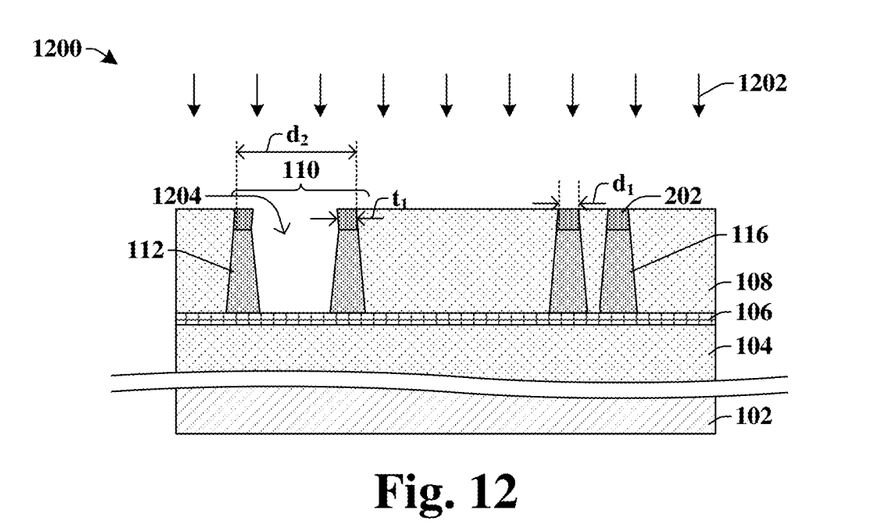

As shown in cross-sectional view 1200 of FIG. 12, in some embodiments, a third removal process 1202 is performed to remove portions of the first conductive material of the first and/or second interconnect conductive structures 116, 110 that do not directly underlie the spacer structure 202. In some embodiments, the third removal process 1202 may comprise a dry etching process such as, for example, a plasma etch, reactive-ion etching, inductively coupled plasma, and/or capacitively coupled plasma. In such embodiments, the third removal process 1202 may utilize one or more of the following gas etchants: a fluoride-based gas (e.g., $CH_3F$, $CHF_3$, $CH_2F_2$, $C_4F_8$, $C_4F_6$, $CF_4$, $NF_3$), chlorine, oxygen, or some other suitable gas. In some embodiments, the third removal process 1202 may be conducted in a chamber set to a temperature in a range of between approximately 15 degrees Celsius and approximately 80 degrees Celsius; and to a pressure in a range of between approximately 0.2 millitorr and approximately 40 millitorr. In some embodiments, the substrate 102 is held within the chamber by an electrostatic chuck during the third removal process 1202. Also, in some embodiments, the spacer structure 202 and the second interconnect dielectric layer 108 are substantially resistant to removal by the third removal process 1202. In other words, in some embodiments, the third removal process 1202 is highly selective to removing the first conductive material compared to the spacer structure 202. In some embodiments, the etch stop layer 106 may also be substantially resistant to removal by the third removal process 1202. Thus, in some embodiments, the spacer structure 202, the second interconnect dielectric layer 108, and the etch stop layer 106 remain after the third removal process 1202.

In some embodiments, after the third removal process 1202 the second interconnect conductive structure 110 comprises an outer portion 112 that directly underlies the spacer structure 202 and comprises the first conductive material. An opening 1204 within the second interconnect conductive structure 110 between the outer portion 112 of the second interconnect conductive structure 110 is present after the third removal process 1202. In some embodiments, the opening 1204 decreases in width the closer the width of the opening 1204 is measured to the etch stop layer 106 as a residual effect of the third removal process 1202.

Figure 13:
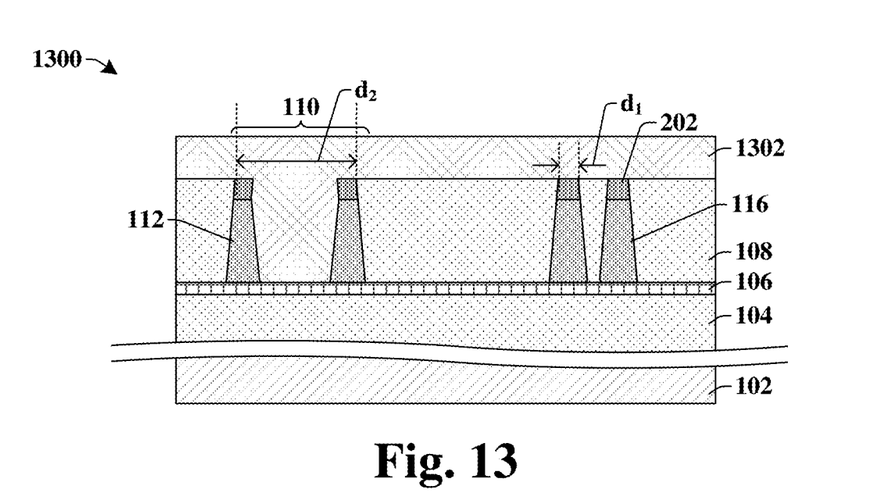

As illustrated in cross-sectional view 1300 of FIG. 13, in some embodiments, a second conductive layer 1302 comprising the second conductive material that is different than the first conductive material is formed over the second interconnect dielectric layer 108 and within the opening 1204 of the second interconnect conductive structure 110. In some embodiments, the second conductive layer 1302 may be formed by way of a deposition process (e.g., PVD, CVD, PE-CVD, ALD, sputtering, etc.). In some embodiments, the second conductive material of the second conductive layer 1302 may comprise, for example, copper, cobalt, aluminum, tungsten, ruthenium, rhodium, titanium, tantalum, a combination thereof, or some other suitable conductive material. In some embodiments, the second conductive layer 1302 may have a thickness in a range of between, for example, approximately 50 angstroms and approximately 600 angstroms. The second conductive layer 1302 comprises a different material than the first conductive layer (502 of FIG. 5).

In some embodiments, the second conductive material of the second conductive layer 1302 is more suitable for features (e.g., the second interconnect conductive structure 110) having a critical dimension (e.g., the second critical dimension $d_2$) that is greater than the predetermined critical dimension threshold compared to the first conductive material of the first interconnect conductive structures 116.

For example, in some embodiments, the predetermined critical dimension threshold may be in a range of between approximately 10 nanometers and approximately 20 nanometers, and the second conductive material of the second conductive layer 1302 may comprise copper. In such embodiments, copper have more suitable electrical properties, such as resistivity, when features comprising copper have a critical dimension greater than the predetermined critical dimension threshold between approximately 10 nanometers and approximately 20 nanometers. In such embodiments, the first conductive material of the first interconnect conductive structure 116 may comprise, for example, ruthenium, tungsten, molybdenum, or rhodium that has more suitable electrical properties, such as resistivity, when features comprising such aforementioned materials have a critical dimension less than the predetermined critical dimension threshold. It will be appreciated that other materials for the first and second conductive materials and that other values of the predetermined critical dimension threshold are also within the scope of this disclosure.

Figure 14:
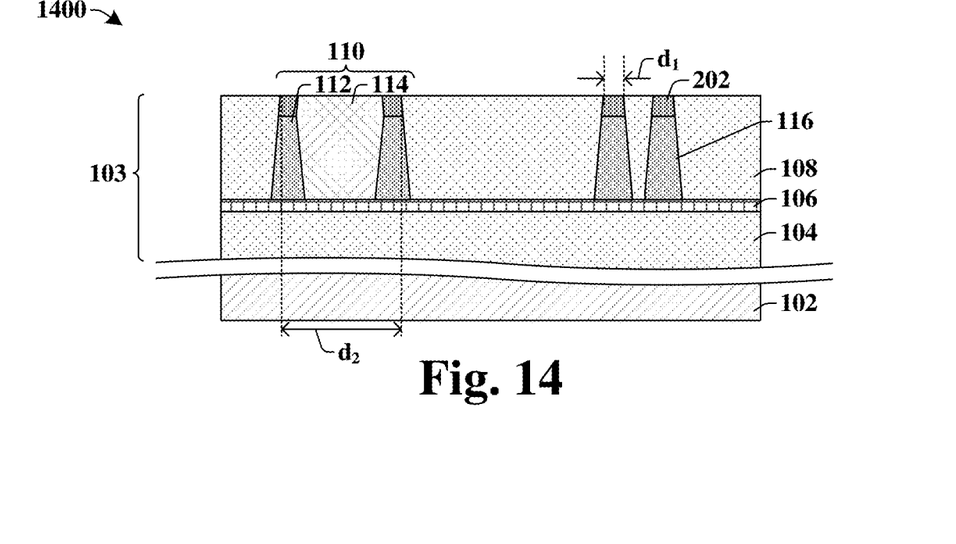

As illustrated in cross-sectional view 1400 of FIG. 14, in some embodiments, a planarization process (e.g., CMP) is performed to remove portions of the second conductive layer (1302 of FIG. 13) arranged over the second interconnect dielectric layer 108. After the planarization process (e.g., CMP) of FIG. 14, the second interconnect conductive structure 110 may comprise a central portion 114 that is surrounded by the outer portion 112 of the second interconnect conductive structure 110 and by the spacer structure 202, wherein the central portion 114 comprises the second conductive material and the outer portion 112 comprises the first conductive material. In some embodiments, a topmost surface of the central portion 114 of the second interconnect conductive structure 110 may be above a topmost surface of the outer portion 112 of the second interconnect conductive structure 110 and also above the topmost surface of the first interconnect conductive structure 116. Further, in some embodiments, the central portion 114 of the second interconnect conductive structure 110 may have a bottommost surface that is more narrow than the topmost surface of the central portion 114 of the second interconnect conductive structure 110.

In some embodiments, the electrical properties, such as resistivity, of the second interconnect conductive structure 110 may be improved because the central portion 114 of the second interconnect conductive structure 110 comprises the second conductive material that is more suitable at the second critical dimension $d_2$ compared to the first conductive material. This way, although the first and second interconnect conductive structures 116, 110 have different varying critical dimensions (e.g., $d_1$, $d_2$) compared to the predetermined critical dimension threshold, the second interconnect conductive structure 110 may still be formed beside the first interconnect conductive structure 116 within the same, second interconnect dielectric layer 108 without sacrificing electrical properties, such as resistivity, of the first and second interconnect conductive structures 116, 110.

Further, it will be appreciated that the first interconnect dielectric layer 104, the etch stop layer 106, the second interconnect dielectric layer 108, the first interconnect conductive structure 116, and the second interconnect conductive structure 110 are part of an interconnect structure 103 arranged over the substrate 102. It will also be appreciated that the interconnect structure 103 may comprise many more or less interconnect conductive structures having other critical dimensions than what is illustrated in the interconnect structure 103 of FIG. 14. Nevertheless, the spacer structure (202 of FIG. 14) and the multiple conductive materials may be utilized to form the interconnect structure 103 that reliably transfers signals (e.g., current, voltage) between various semiconductor devices, photo devices, and/or other electronic devices (not shown) arranged above and below the interconnect structure 103.

Figure 15:
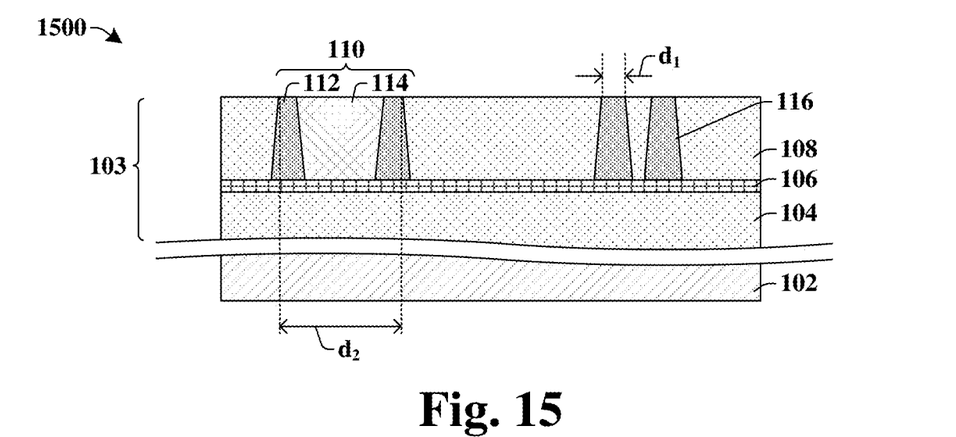

As illustrated in cross-sectional view 1500 of FIG. 15, in some embodiments, the planarization process (e.g., CMP) as discussed in FIG. 14 also completely removes the spacer structure (202 of FIG. 15) from the first interconnect conductive structure 116 and the outer portion 112 of the second interconnect conductive structure 110. In such embodiments, the first interconnect conductive structure 116, the second interconnect dielectric layer 108, and the outer and central portions 112, 114 of the second interconnect conductive structure 110 may have topmost surfaces that are substantially coplanar. In some embodiments, by completely removing the spacer structure (202 of FIG. 14), the overall height of the interconnect structure 103 is reduced.

Figure 16:
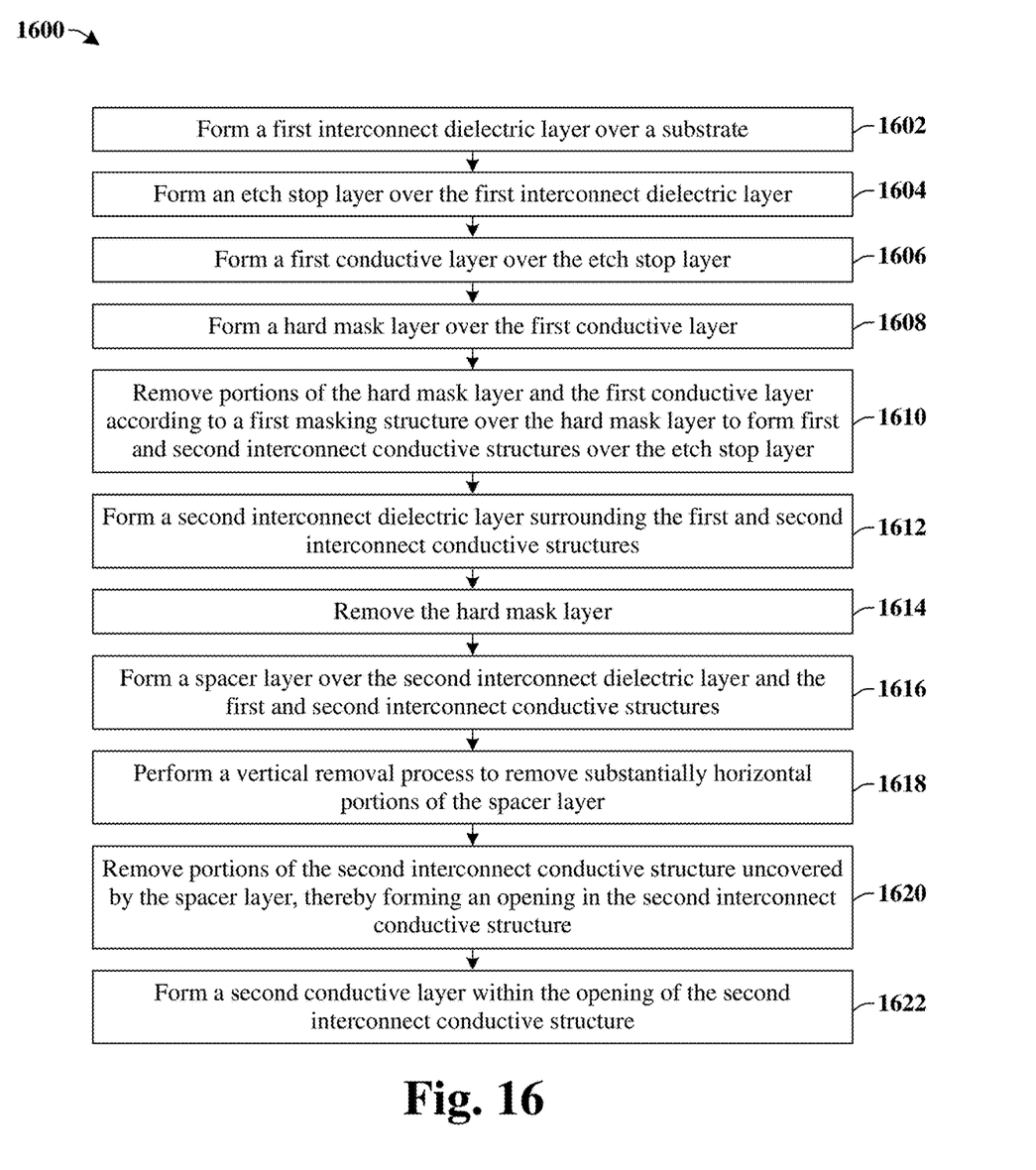
FIG. 16 illustrates a flow diagram of some embodiments of a method corresponding to the method illustrated in FIGS. 4-15.

FIG. 16 illustrates a flow diagram of some embodiments of a method 1600 corresponding to the cross-sectional views 400-1500 of FIGS. 4-15, respectively.

While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1602, a first interconnect dielectric layer is formed over a substrate. FIG. 4 illustrates cross-sectional view 400 of some embodiments corresponding to act 1602.

At act 1604, an etch stop layer is formed over the first interconnect dielectric layer.

At act 1606, a first conductive layer is formed over the etch stop layer.

At act 1608, a hard mask layer is formed over the first conductive layer. FIG. 5 illustrates cross-sectional view 500 of some embodiments corresponding to acts 1604, 1606, and 1608.

At act 1610, portions of the hard mask layer and the first conductive layer are removed according to a first masking structure over the hard mask layer to form first and second interconnect conductive structures over the etch stop layer. FIG. 7 illustrates cross-sectional view 700 of some embodiments corresponding to act 1610.

At act 1612, a second interconnect dielectric layer surrounding the first and second interconnect conductive structures is formed. FIG. 8 illustrates cross-sectional view 800 of some embodiments corresponding to act 1612.

At act 1614, the hard mask layer is removed. FIG. 9 illustrates cross-sectional view 900 of some embodiments corresponding to act 1614.

At act 1616, a spacer layer is formed over the second interconnect dielectric layer and the first and second interconnect conductive structures. FIG. 10 illustrates cross-sectional view 1000 of some embodiments corresponding to act 1616.

At act 1618, a vertical removal process is performed to remove substantially horizontal portions of the spacer layer. FIG. 11 illustrates cross-sectional view 1100 of some embodiments corresponding to act 1618.

At act 1620, portions of the second interconnect conductive structure that are uncovered by the spacer layer are removed to form an opening in the second interconnect conductive structure. FIG. 12 illustrates cross-sectional view 1200 of some embodiments corresponding to act 1620.

At act 1622, a second conductive layer is formed within the opening of the second interconnect conductive structure. FIG. 13 illustrates cross-sectional view 1300 of some embodiments corresponding to act 1622.

Therefore, the present disclosure relates to a method of forming a first interconnect conductive structure laterally beside a second interconnect conductive structure, wherein the first interconnect conductive structure has a smaller critical dimension than that of the second interconnect conductive structure such that the first interconnect conductive structure comprises a first conductive material, and the second interconnect conductive structure comprises a second conductive material to increase the reliability of the overall interconnect structure.

Accordingly, in some embodiments, the present disclosure relates to an integrated chip comprising: a first interconnect dielectric layer arranged over a substrate; a second interconnect dielectric layer arranged over the first interconnect dielectric layer; and an interconnect conductive structure arranged within the second interconnect dielectric layer and comprising: an outer portion comprising a first conductive material, and a central portion comprising a second conductive material that is different than the first conductive material, wherein outermost sidewalls of the central portion are laterally surrounded by the outer portion.

In other embodiments, the present disclosure relates to an integrated chip comprising: an interconnect dielectric layer arranged over a substrate; a first interconnect conductive structure arranged within the interconnect dielectric layer and comprising a first conductive material; and a second interconnect conductive structure arranged within the interconnect dielectric layer, arranged laterally beside the first interconnect conductive structure, and comprising: an outer portion comprising a first conductive material, and a central portion comprising a second conductive material that is different than the first conductive material, wherein outermost sidewalls of the central portion are laterally surrounded by the outer portion.

In yet other embodiments, the present disclosure relates to method comprising: forming an etch stop layer over a substrate; forming a first conductive layer over the etch stop layer; forming a hard mask layer over the first conductive layer; removing portions of the hard mask layer and the first conductive layer according to a first masking structure to form a first interconnect conductive structure spaced apart from a second interconnect conductive structure over the etch stop layer; forming an interconnect dielectric layer over the etch stop layer and laterally surrounding the first and second interconnect conductive structures; removing the hard mask layer; forming a spacer layer over the interconnect dielectric layer and over the first and second interconnect conductive structures; removing substantially horizontal portions of the spacer layer; removing portions of the second interconnect conductive structure uncovered by the spacer layer to form an opening in the second interconnect conductive structure; and forming a second conductive layer within the opening over the second interconnect conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an etch stop layer over a substrate;
    forming a first conductive layer over the etch stop layer;
    forming a hard mask layer over the first conductive layer;
    removing portions of the hard mask layer and the first conductive layer according to a first masking structure to form a first interconnect conductive structure spaced apart from a second interconnect conductive structure over the etch stop layer;
    forming an interconnect dielectric layer over the etch stop layer and laterally surrounding the first and second interconnect conductive structures;
    removing the hard mask layer;
    forming a spacer layer over the interconnect dielectric layer and over the first and second interconnect conductive structures, wherein a bottommost surface of the spacer layer is directly over the first interconnect conductive structure or the second interconnect conductive structure;
    removing substantially horizontal portions of the spacer layer to uncover portions of the second interconnect conductive structure;
    removing the portions of the second interconnect conductive structure uncovered by the spacer layer to form an opening in the second interconnect conductive structure; and
    forming a second conductive layer within the opening in the second interconnect conductive structure.

2. The method of claim 1, wherein the first interconnect conductive structure has a first critical dimension that is less than a first predetermined critical dimension threshold, and wherein the second interconnect conductive structure has a second critical dimension that is greater than a second predetermined critical dimension threshold.

3. The method of claim 1, wherein the removing of the substantially horizontal portions of the spacer layer completely confines an entirety of the spacer layer directly above the first interconnect conductive structure and the second interconnect conductive structure.

4. The method of claim 1, further comprising:
    performing a planarization process to remove the spacer layer from the first and second interconnect conductive structures.

5. A method comprising:
    forming an etch stop layer over a first interconnect dielectric layer;
    forming a first conductive layer over the etch stop layer;
    forming a first mask layer over the first conductive layer;

forming a masking structure over the first mask layer, wherein the masking structure has a first segment and a second segment;
etching the first mask layer and the first conductive layer according to the masking structure to form a first interconnect and a second interconnect;
forming a second interconnect dielectric layer over the etch stop layer and laterally surrounding the first mask layer;
planarizing the second interconnect dielectric layer, wherein the first mask layer extends to a height of a top surface of the second interconnect dielectric layer after planarizing the second interconnect dielectric layer;
removing the first mask layer from over the first interconnect to expose a top surface of the first interconnect after planarizing the second interconnect dielectric layer;
etching the first interconnect, after planarizing the top surface of the second interconnect dielectric, to form a first conductive structure and a second conductive structure; and
forming a second conductive layer over the etch stop layer and between the first conductive structure and the second conductive structure, wherein the first conductive layer comprises a first material and the second conductive layer comprises a second material such that the first material is different from the second material.

6. The method of claim 5, wherein the second interconnect dielectric layer is formed onto an upper surface of the etch stop layer in areas between the first interconnect and the second interconnect.

7. The method of claim 5, further comprising:
forming a second mask layer over the first interconnect after removing the first mask layer, wherein the second mask layer laterally contacts the second interconnect dielectric layer.

8. The method of claim 5, wherein a topmost surface of the first conductive structure is below the top surface of the second interconnect dielectric layer.

9. The method of claim 5, wherein etching the first interconnect exposes sidewalls of the first material.

10. The method of claim 5, wherein a bottommost surface of the first conductive structure and a bottommost surface of the second conductive layer both vertically and physically contact the etch stop layer.

11. The method of claim 10, further comprising:
forming a spacer layer over the second interconnect dielectric and along sidewalls of the second interconnect dielectric; and
removing portions of the spacer layer so that the spacer layer lies entirely above the first conductive layer such that the second conductive layer is laterally surrounded by the first conductive structure and the second conductive structure and is further laterally surrounded by the spacer layer.

12. The method of claim 11, wherein after forming the spacer layer, the spacer layer has a thickness in a region directly above a topmost surface of the first interconnect that is less than a thickness of the spacer layer in a region directly above a topmost surface of the second interconnect.

13. A method comprising:
forming a lower dielectric on a substrate, the lower dielectric having sidewalls laterally surrounding a lower conductive interconnect;
forming interconnect structures and an interconnect dielectric vertically over an upper surface of the lower dielectric, the interconnect structures including a first interconnect structure and a second interconnect structure laterally separated by the interconnect dielectric;
forming a mask directly over the first interconnect structure, wherein the mask is vertically below a top of the interconnect dielectric, has sidewalls that form an opening exposing a central part of the first interconnect structure in a cross-sectional view, and completely covers a top of the second interconnect structure in the cross-sectional view;
etching the first interconnect structure according to the mask to remove a first conductive material from the central part of the first interconnect structure after forming the interconnect dielectric, wherein the etching forms an interconnect recess that completely separates, from a topmost surface to a bottommost surface of the first interconnect structure, outer portions of the first interconnect structure, and wherein the interconnect recess exposes a sidewall of the first conductive material;
forming a second conductive material within the interconnect recess, wherein the second conductive material is different from the first conductive material; and
removing portions of the second conductive material that lie above the interconnect dielectric.

14. The method of claim 13, further comprising:
forming the first interconnect structure over an etch stop layer, wherein the first conductive material and the second conductive material have bottommost surfaces that physically contact a topmost surface of the etch stop layer.

15. The method of claim 13, wherein a width of the interconnect recess monotonically increases from a bottom of the first conductive material to a top of the first conductive material.

16. The method of claim 13, wherein the lower conductive interconnect comprises a metal.

17. The method of claim 16, wherein the lower dielectric continuously extends from directly below the first interconnect structure to directly below the second interconnect structure.

18. The method of claim 17, wherein a height of the second conductive material, as measured between a bottom surface and a top surface of the second conductive material, is equal to a height of the first conductive material, as measured between a bottom surface and a top surface of the first conductive material.

19. The method of claim 13, further comprising:
forming a masking layer onto the topmost surface of the first interconnect structure and the top of the interconnect dielectric, wherein the masking layer has a first upper surface over the first interconnect structure and a second upper surface over the interconnect dielectric, the second upper surface over the first upper surface; and
removing parts of the masking layer to form the mask.

20. The method of claim 5, further comprising:
performing a second planarization process after forming the second conductive layer, wherein after the second planarization process the second conductive layer has a same vertical dimension as the first conductive structure and the second conductive structure.

* * * * *